(12) United States Patent
Redaelli

(10) Patent No.: US 9,990,994 B2
(45) Date of Patent: Jun. 5, 2018

(54) METHODS OF PROGRAMMING MEMORIES HAVING A SHARED RESISTANCE VARIABLE MATERIAL

(71) Applicant: MICRON TECHNOLOGY, INC., Boise, ID (US)

(72) Inventor: Andrea Redaelli, Via San Giovanni Bosco (IT)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/854,916

(22) Filed: Dec. 27, 2017

(65) Prior Publication Data

US 2018/0122473 A1    May 3, 2018

Related U.S. Application Data

(60) Division of application No. 15/488,828, filed on Apr. 17, 2017, now Pat. No. 9,881,673, which is a division of application No. 14/551,317, filed on Nov. 24, 2014, now Pat. No. 9,640,254, which is a continuation of application No. 13/530,732, filed on Jun. 22, 2012, now Pat. No. 8,971,104.

(51) Int. Cl.
*G11C 13/04* (2006.01)
*G11C 13/00* (2006.01)
*H01L 45/00* (2006.01)
*G11C 11/56* (2006.01)
*H01L 27/24* (2006.01)

(52) U.S. Cl.
CPC ...... *G11C 13/0069* (2013.01); *G11C 11/5685* (2013.01); *G11C 13/004* (2013.01); *G11C 13/0028* (2013.01); *H01L 27/2472* (2013.01); *H01L 45/1233* (2013.01); *H01L 45/141* (2013.01); *G11C 2013/008* (2013.01); *H01L 27/2445* (2013.01)

(58) Field of Classification Search
CPC .................................................. H01L 27/2445
USPC .............................................. 365/163; 257/4
See application file for complete search history.

(56) References Cited

U.S. PATENT DOCUMENTS

| | | | |
|---|---|---|---|
| 7,158,421 B2 | 1/2007 | Li et al. | |
| 7,405,964 B2 | 7/2008 | Philipp et al. | |
| 7,471,557 B2 | 12/2008 | Johnson | |
| 7,706,180 B2 | 4/2010 | Jenne | |
| 2008/0304311 A1 | 12/2008 | Philipp et al. | |
| 2011/0001114 A1* | 1/2011 | Zanderighi | H01L 27/2445 257/4 |

* cited by examiner

*Primary Examiner* — Jason Lappas
(74) *Attorney, Agent, or Firm* — Dicke, Billig & Czaja, PLLC

(57) ABSTRACT

Methods for programming data to an array of memory cells having a first memory cell, a second memory cell that is adjacent to the first memory cell in a first direction along a first axis, and a third memory cell that is adjacent to the first memory cell in a second direction along a second axis.

20 Claims, 6 Drawing Sheets

METHODS OF PROGRAMMING MEMORIES HAVING A SHARED RESISTANCE VARIABLE MATERIAL

RELATED APPLICATION

This Application is a Divisional of U.S. application Ser. No. 15/488,828, titled "MEMORIES HAVING A SHARED RESISTANCE VARIABLE MATERIAL," filed Apr. 17, 2017 (allowed), which is a Divisional of U.S. application Ser. No. 14/551,317, titled "MEMORIES AND METHODS OF OPERATING MEMORIES HAVING MEMORY CELLS SHARING A RESISTANCE VARIABLE MATERIAL," filed Nov. 24, 2014, now U.S. Pat. No. 9,640,254 issued on May 2, 2015, which is a Continuation of U.S. application Ser. No. 13/530,732, titled "MEMORY PROGRAMMING TO REDUCE THERMAL DISTURB," filed Jun. 22, 2012, now U.S. Pat. No. 8,971,104 issued on Mar. 3, 2015, which are commonly assigned and incorporated herein by reference.

TECHNICAL FIELD

The present embodiments relate generally to memory and a particular embodiment relates to memory programming to reduce thermal disturb.

BACKGROUND

Non-volatile memory is presently designed into a large number of electronic devices that require relatively permanent storage of data even after power is removed. Common uses for non-volatile memory include personal computers, solid state drives, digital cameras, and cellular telephones. For example, program code and system data such as a basic input/output system (BIOS) are typically stored in non-volatile memory for use in personal computer systems.

Typical types of non-volatile memory include magnetic disk drives, optical disk drives, flash memory, and phase change memory (PCM). Flash memory has typically been the most common type of non-volatile memory used in electronic devices that are small and battery powered. However, flash memory is relatively slow to program that can result in a potential data bottleneck when implemented in a high speed system.

PCM is a resistive memory technology that can provide non-volatile storage but has the potential of relatively faster operation compared to flash memory. PCM, as the name implies, uses the change in resistance of a material when it changes phase in order to store data in a non-volatile manner. For example, an alloy of different elements might change from a crystalline phase having a low resistance to an amorphous phase having a high resistance. If the material could exhibit multiple distinctly different resistances, each different resistance can then be assigned a respective data value (e.g., 00, 01, 10, 11).

The phase change in PCM is brought about by heating the phase change material of each memory cell when it is addressed. This can be accomplished by a heater for each memory cell. When the heater is enabled by a current, it heats a chalcogenide alloy (e.g., germanium, antimony and tellurium (GeSbTe) or GST). When GST is heated to a relatively high temperature (e.g., over 600° C.), its chalcogenide crystallinity is lost. The GST cools into an amorphous glass-like state having a high electrical resistance. By heating the chalcogenide alloy to a temperature above its crystallization point but below the melting point it will transform back into a crystalline state having a lower electrical resistance.

FIG. 1 illustrates a schematic diagram of a portion of a typical prior art PCM array 100. The PCM array 100 includes a number of memory cells 101, each including a select device 110 coupled to a resistive storage element 111. The select devices 110 can include, for example, field effect transistors (FETs), such as MOSFETs, or bipolar junction transistors (BJTs), or diodes.

Referring to FIG. 1, the select device 110 is shown as a three terminal FET where the gate of each select device 110 is coupled to one of a number of access lines WL0-WLn (e.g., word lines). Each word line WL0-WLn is coupled in such a fashion to its respective row of memory cells. A second terminal of each FET is coupled to its respective resistive storage element 111. A third terminal of each FET is coupled to a circuit common reference. Each resistive storage element 111 is also coupled to a respective data line BL0-BLm (e.g., bit line). Each bit line BL0-BLm is coupled to its respective column of memory cells.

The word lines WL0-WLn are coupled to one or more access (e.g., row) decoders (not shown) that are used to selectively access the word lines. The bit lines BL0-BLm are coupled to the sense circuitry, through a decoder hierarchy, that senses either a voltage or a current in order to determine the programmed state of the respective memory cells that have been accessed by the word line.

One problem with PCM is the thermal transfer that can occur when an adjacent memory cell is programmed. This is typically referred to in the art as thermal disturb. The heat resulting from the programming process of one memory cell can transfer to the adjacent memory cell causing it to either be programmed or change the resistance of the already programmed cell, thus changing the valued of the stored data.

For the reasons stated above and for other reasons that will become apparent to those skilled in the art upon reading and understanding the present specification, there is a need in the art for reducing the effects of thermal disturb in a phase change memory device.

DETAILED DESCRIPTION

Figure 1:
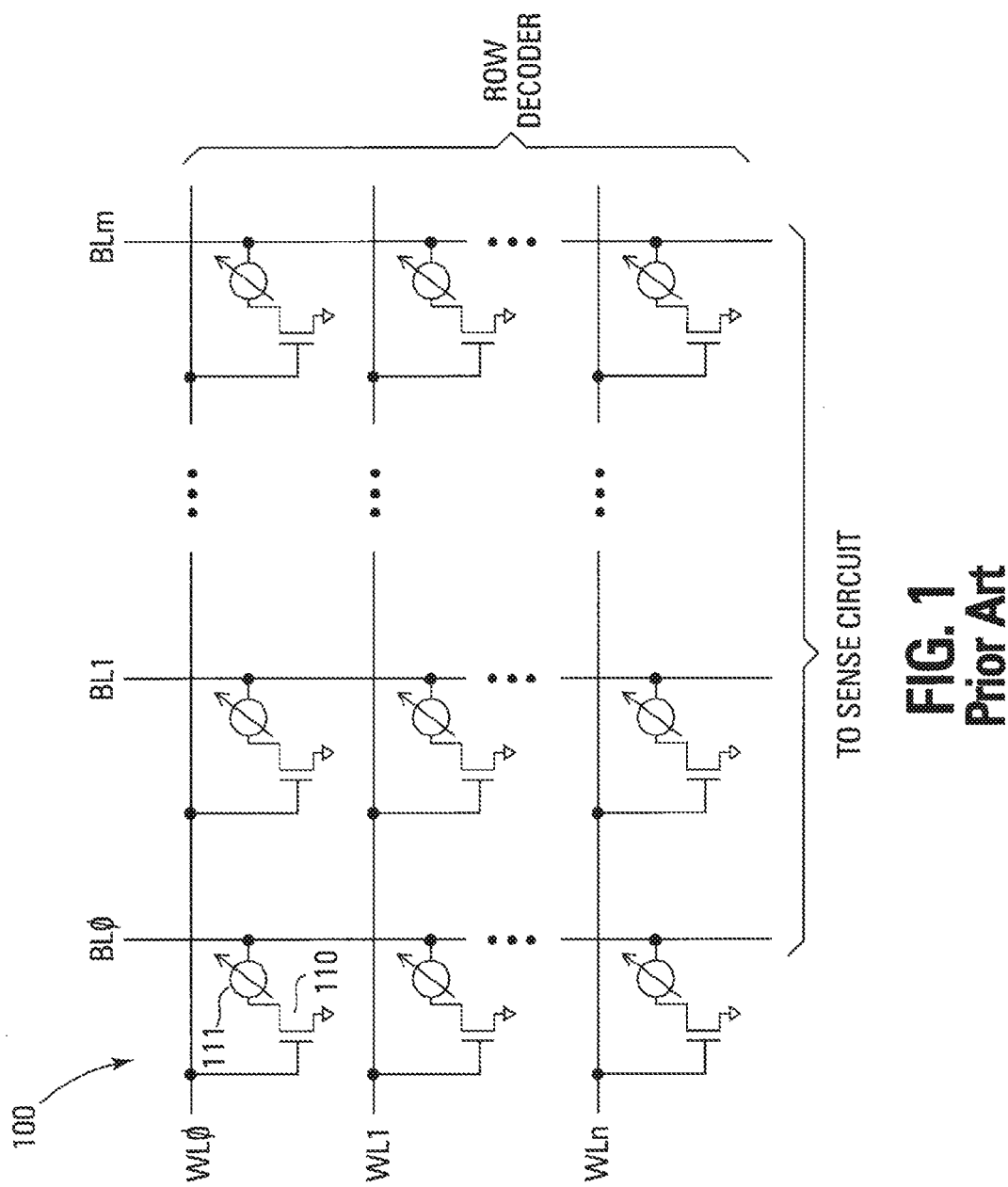
FIG. 1 shows a schematic diagram of a portion of a typical prior art PCM array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
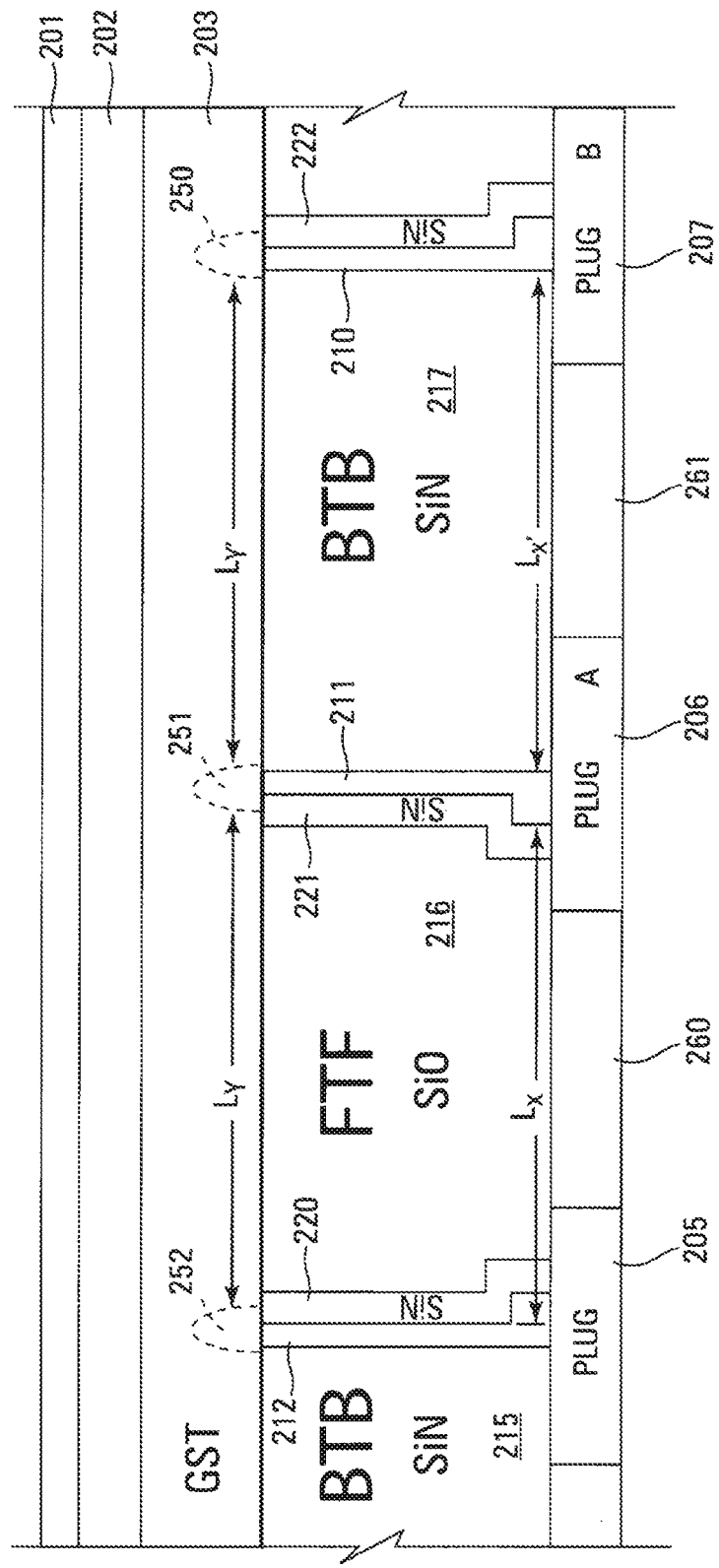
FIG. 2 shows a cross-sectional view of one embodiment of PCM cells.

FIG. 2 illustrates a cross-sectional view, in a bit line direction, of one embodiment of PCM cells and their supporting structure. The cross-sectional view shows a top layer 201 that can be a metal layer acting as a bit line or coupled to a bit line. The top layer 201 is formed on a capping layer 202 that is formed over a resistance variable material (e.g., phase change material). The resistance variable (e.g., phase change) material can be a chalcogenide material (e.g., GeSbTe) that can be referred to as GST but alternate embodiments can include another resistance variable material.

The cross-sectional view shows three memory cell areas 250-252 that can be formed within the GST layer 203. The memory cell areas 250-252 are above the memory cell heaters 210-212 such that each memory cell 250-252 has a different heater 210-212. The heaters 210-212 have a SiN material on either side.

The heaters 210-212 are formed over plugs 205-207 that each act as, or are coupled to, a word line. The plugs 205-207 are separated by a dielectric material 260, 261. One of the plugs 206 is labeled as an "A" plug and an adjacent plug 207 is labeled as a "B" plug. The use of these labels will become evident subsequently with reference to FIG. 4.

It can be seen that the heaters 210-212 are formed as an "L" shape. A SiN material 220-222 is formed on the one side of each "L" heater. An insulator material 216 (e.g., SiO) is formed between the two SiN layers 220, 221. The memory cell 251 associated with the center-most heater 211 is considered to be in a Front-to-Front (FTF) relationship with respect to the left-most memory cell 252.

The heater 210 associated with the right-most memory cell 250 has its "L" shape pointed away from the center heater 211 (e.g., the "L" shaped heaters are back-to-back). These two heaters 210, 211 are separated by SiN 217. The memory cell 250 associated with the right-most heater 210 is considered to be in a Back-to-Back (BTB) relationship with respect to the center-most memory cell 251.

The left-most memory cell 252 is also considered to be in a BTB relationship with respect to an adjacent memory cell to the left (not shown) for the same reasoning. The left-most heater 212 also has SiN 215 between it and the adjacent heater (not shown).

Thus, it can be seen from FIG. 2 that BTB memory cells 250, 251 share a SiN region along the bit line direction. FTF memory cells 251, 252 share a SiO insulator along the bit line direction.

In operation, the memory cells 250-252 are programmed by providing a current through the heaters 210-212 causing an increase in temperature of the memory cell area in the GST layer 203 above the respective heater 210-212. When the temperature is high enough to melt the area of the GST layer 203 above the heater 210-212, an amorphous dome 250-252 is formed in the GST layer 203 that increases the resistance of that area, thus programming that particular memory cell.

Since an amorphous material is metastable, the memory cell 250-252 can be erased by increasing the temperature of the memory cell to a crystallization temperature that is typically lower than the temperature used to program the memory cell. The crystallization temperature causes the amorphous dome to crystallize back to the crystal state, thus erasing the memory cell.

The time required to program and/or erase the memory cells depends on the temperatures used. A small increase of the temperature translates into faster crystallization according to the exponential relationship between time and temperature, i.e., the crystallization Arrhenius Law. After multiple write/erase operations of a neighbor memory cell, a previously programmed bit can be potentially stressed for many seconds (e.g., number of disturb operations of neighbor cell x time of the single pulse). This corresponds to a temperature on the disturbed memory cell of 170°-250° C. that is lower than a programming temperature but still potentially disturbing for that length of time.

It can be seen that heat from one heater might be conducted along the GST material 203 to an adjacent memory cell, thus causing thermal disturb in the adjacent memory cells. For example, referring to FIG. 2, if the right-most memory cell 250 is already programmed, programming of the center-most memory cell 251 can cause the temperature of the right-most memory cell 250 to also increase. Over a number of programming operations, this can cause thermal disturb of programmed memory cells.

In one specific embodiment, memory cells typically suffer thermal disturb in the bit line direction. Since the memory cells are insulated from adjacent memory cells in the word line direction, thermal disturb is not normally a problem in the word line direction. In one embodiment, the thermal disturb is worse in the bit line direction since the GST is continuous (i.e., not cut). In the word line direction, the GST is cut between memory cells so that the temperature is more limited.

Figure 3:
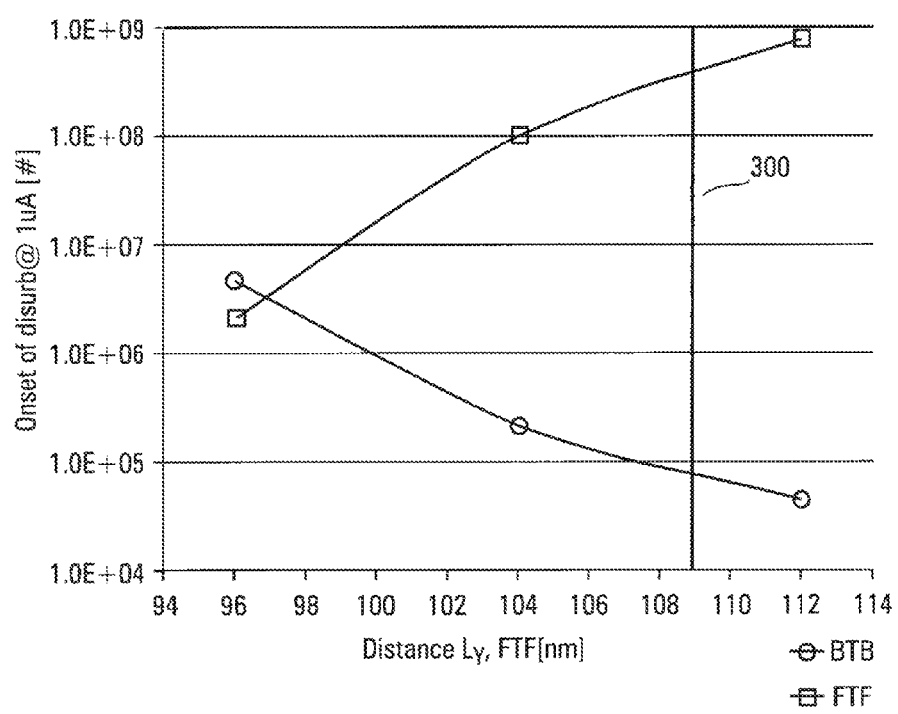
FIG. 3 shows an onset of disturb versus a distance between memory cells along a bit line.

In one specific embodiment, the thermal disturb in the bit line direction is not symmetrical. Referring to FIG. 2, it can be seen that the heater 211 for the center memory cell 251 is spaced from the left-most heater 212 by a distance of $L_x$ and the center memory cell 251 is spaced from the left-most memory cell 252 by a distance of $L_y$. Meanwhile, the heater 211 for the center memory cell 251 is spaced from the right-most heater 210 by a distance of $L_{3}$, and the center memory cell 251 is spaced from the right-most memory cell 250 by a distance of $L_{y'}$. As shown in FIG. 3, the BTB memory cell pairs are more susceptible to thermal disturb than the FTF memory cell pairs.

FIG. 3 illustrates the current number of cycles performed on a neighbor memory cell that could result in data loss in an observed memory cell (1 µA is the data loss criterion) as a function of the spacing between the memory cells for the specific embodiments of FIG. 2. The two curves refer to FTF or BTB memory cells. The x-axis of the graph is the distance $L_y$ in nanometers. The y-axis of the graph is the onset of thermal disturb at 1 µA as a number of program/erase cycles.

By picking a point 300 on the graph at $L_y$=109 nm, it can be seen that the number of program/erase cycles that can cause disturb in FTF memory cell pairs is substantially much more than the number of program/erase cycles that can cause thermal disturb in BTB memory cell pairs. Thus, a programming method can reduce the occurrence of thermal disturb by, for example, simultaneously programming pairs of adjacent data bits that can cause thermal disturb i.e., in the embodiment of FIG. 2 BTB pairs. This is further illustrated in the schematic of FIG. 4.

Figure 4:
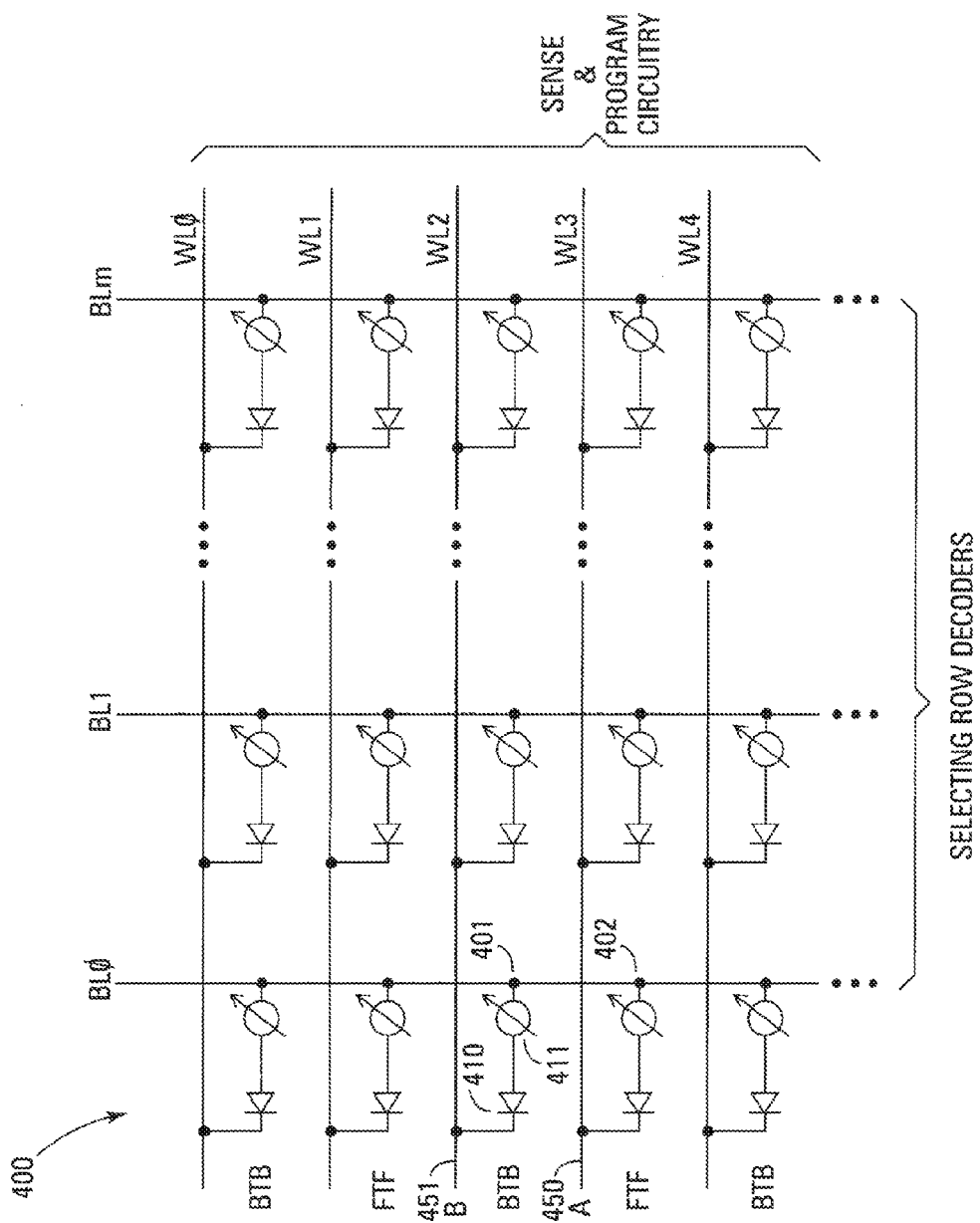
FIG. 4 shows schematic diagram of a portion of a PCM array.

FIG. 4 illustrates a schematic diagram of a portion of a resistive memory array (e.g., PCM array) 400. The PCM array 400 includes a number of memory cells 401, each having a select device 410 coupled to a resistive storage element 411. The memory cells 401 can include heater elements, conductive elements, and resistive storage elements as described previously. The resistive storage elements 411 can include a resistance variable material (e.g., phase change material).

The select devices 410 can include field effect transistors (FETs) (e.g., MOSFETs), bipolar junction transistors (BJTs), BJTs operated as diodes, or diodes. Although the select devices 410 are shown in FIG. 4 as two terminal select devices, alternate embodiments can use other select devices 410 with a different number of terminals.

Referring to FIG. 4, the select device 410 is shown as a two terminal device where the cathode terminal of each select device 410 is coupled to one of a number of access lines (e.g., word lines WL0-WL4). Each word line WL0-WL4 is coupled in such a fashion to its respective row of memory cells. The word lines WL0-WL4 are coupled to sense and programming circuitry. Only five word lines are shown in FIG. 4 for purposes of clarity and brevity. One skilled in the art will realize that a memory device can have a large number of word lines in an array.

The anode terminal of each select device 410 is coupled to a respective resistive storage element 411 of a respective memory cell. Each resistive storage element 411 is also coupled to a respective data line (e.g., bit lines BL0-BLm). Each bit line BL0-BLm is coupled to its respective column of memory cells. The bit lines BL0-BLm are coupled to access decoders. Only three bit lines are shown in FIG. 4 for purposes of clarity and brevity. One skilled in the art will realize that a memory device can have a large number of bit lines in an array. The select devices 410 are enabled/disabled (e.g., turned on/off) in order to select/deselect its respective memory cell 401.

One word line 450 coupled to a memory cell 402 is labeled A while its adjacent word line 451 coupled to a second memory cell 401 is labeled B. It can be seen that the first memory cell 402 shares a BTB relationship with the second memory cell 401. Referring to the cross-sectional view of FIG. 2, it can be seen that the memory cell 251 associated with the heater coupled to plug A 206 shares a common SiN material 217 with the memory cell 250 associated with the heater coupled to plug B 207.

By programming data to the BTB memory cells 401, 402 simultaneously, thermal disturb can be reduced. Thus, while programming memory cells in the bit line direction, when a memory cell is being programmed, it is programmed along with an adjacent memory cell with which it shares a BTB relationship. In order to accomplish this, the word lines are treated like typical bit lines of the prior art in that the word lines of the array of FIG. 4 are coupled to sense and programming circuitry. Similarly, the bit lines of the array of FIG. 4 are treated like typical word lines of the prior art in that the bit lines of the array of FIG. 4 are coupled to selecting access decoders.

Figure 5:
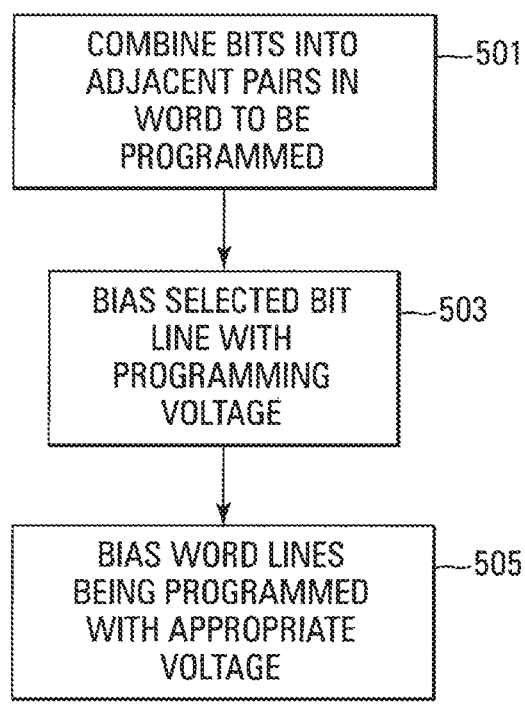
FIG. 5 shows flowchart of one embodiment of a method for programming a PCM array.

FIG. 5 illustrates a flowchart of one embodiment of a method for programming the array of FIG. 4. This method can reduce the thermal disturb typically experienced by adjacent memory cells along a given axis (e.g., in a bit line direction).

The method initially builds a word to be programmed by combining data bits into multiple bit pairs that can be programmed into adjacent memory cells 501. In one embodiment, the bits are combined into bit pairs such that two memory cells that share a BTB relationship are programmed during the same programming operation so that they are programmed simultaneously. In one embodiment, each adjacent BTB memory cell pair shares the same SiN material.

The building of the logical word for programming can also be referred to as remapping the data from one location to another. The data that is remapped to different locations for the purpose of programming as a pair of data bits is tracked so that when the data is read out of the memory, it can be mapped back to its original location in the data word.

For example, if a memory device receives, from an external controller, a 32-bit logical data word to be programmed, the logical data word might include a data bit in one location of the word that is to be programmed while the adjacent bit location is not to be programmed. The data remapping would replace the data bit that originally was not to be programmed with a data bit to be programmed. The resulting pair could also be moved within the logical word such that one bit is programmed to a first memory cell and the other to a second memory cell having a BTB relationship with the first memory cell and that shares a SiN material with the first memory cell.

The selected bit line to be programmed is biased with a relatively high programming voltage 503. In one embodiment, the high programming voltage is a series of incrementally increasing programming pulses. Since the row decoders are coupled to the bit lines, the selecting row decoder can provide the relatively high programming voltage. In an alternate embodiment, the programming voltage can be a negative voltage such that the programming pulses are a series of incrementally more negative programming pulses.

The word lines that are coupled to the memory cells being programmed along the selected bit line are also biased with an appropriate voltage for programming the memory cells 505. In one embodiment, this is a relatively low voltage (e.g., 0V) as compared to the programming voltage.

Figure 6:
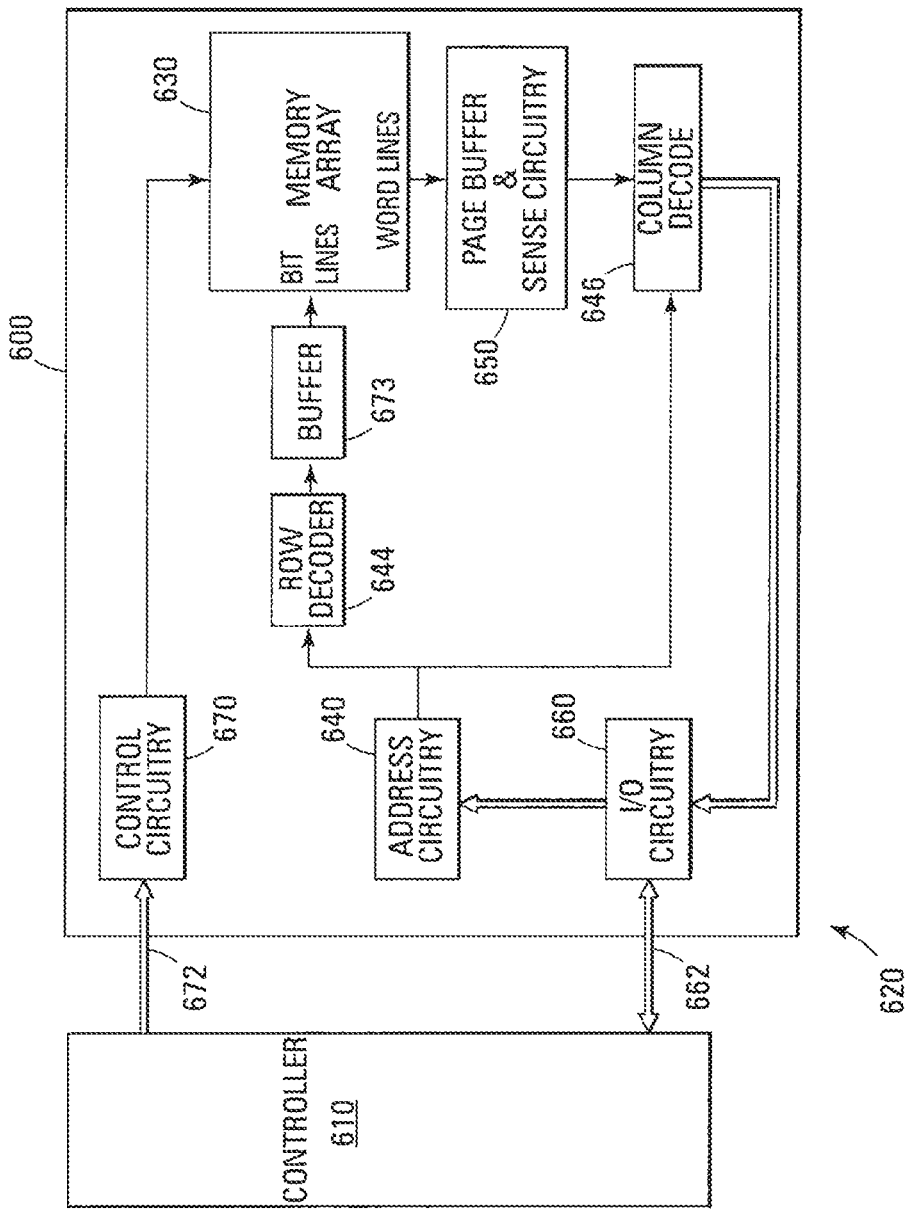
FIG. 6 shows a block diagram of one embodiment of a system that can incorporate a memory device in accordance with the PCM array of FIG. 4.

FIG. 6 illustrates a functional block diagram of a memory device 600 that can comprise a PCM array architecture such as illustrated in FIG. 4 and can be programmed using the programming methods disclosed herein. The memory device 600 is coupled to an external controller 610. The external controller 610 may be a microprocessor or some other type of controller. The memory device 600 and the external controller 610 form part of a system 620.

The memory device 600 includes an array 630 of memory cells (e.g., PCM memory cells). The memory array 630 is arranged in banks of word line rows and bit line columns.

Address buffer circuitry 640 is provided to latch address signals provided through I/O circuitry 660. Address signals are received and decoded by a row decoder 644 and a column decoder 646 to access the memory array 630.

The memory device 600 reads data in the memory array 630 by sensing resistance changes in the memory array columns using sense circuitry 650. The sense circuitry 650, in one embodiment, is coupled to read and latch a row of data from the memory array 630. The sense circuitry 650, as previously described, includes the sense circuitry as well as other circuits for performing a program verify operation. Data are input and output through the I/O circuitry 660 for bidirectional data communication as well as the address communication over a plurality of data connections 662 with the controller 610.

An internal controller (e.g., control circuitry and firmware) 670 decodes signals provided on a control interface 672 from the external controller 610. These signals are used to control the operations on the memory array 630, including data read, data write (program), and erase operations. The internal controller 670 may be a state machine, a sequencer, or some other type of controller to generate the memory control signals. In one embodiment, the internal controller 670 is configured to control execution of the programming embodiments of the present disclosure. In one embodiment, the internal controller is responsible for tracking the remapping of the data into data bit pairs such that the data can be read properly during a read operation.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments of a resistive memory array that is programmed such that adjacent pairs of memory cells along a bit line in a BTB relationship are programmed together. By programming pairs of adjacent memory cells in a BTB relationship along a bit line, the thermal disturb of memory cells during programming can be reduced. Other embodiments have also been discussed.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for programming data to an array of memory cells, wherein the array of memory cells comprise a first memory cell, a second memory cell that is adjacent to the first memory cell in a first direction along a first axis, and a third memory cell that is adjacent to the first memory cell in a second direction along a second axis, wherein the first and third memory cells are back-to-back memory cells that share a same chalcogenide material area that is not cut, the method comprising programming the data to the first and the third memory cells.

2. The method of claim 1, wherein the chalcogenide material is GeSbTe.

3. The method of claim 1, wherein the chalcogenide material is formed in a bit line direction.

4. The method of claim 1, wherein the first and second memory cells are separated by a first distance in the first direction along the first axis, and wherein the back-to-back first and third memory cells that are separated by a second distance, less than the first distance, in the second direction along the second axis.

5. The method of claim 4, wherein the first axis and the second axis are a same axis in a direction of a data line coupled to each of the first memory cell, the second memory cell and the third memory cell.

6. The method of claim 1, wherein programming the data to the first and the third memory cells comprises programming a particular bit of data of a plurality of bits of data to the first memory cell, and programming a different bit of data of the plurality of bits of data to the third memory cell.

7. A method for programming data to an array of memory cells, wherein the array of memory cells comprise a first memory cell, a second memory cell that is adjacent to the first memory cell in a first direction along an axis, and a third memory cell that is adjacent to the first memory cell in a second direction along the axis that is opposite the first direction, wherein the first memory cell and the second memory cell are separated by a first distance along the axis and the first memory cell and the third memory cell are separated by a second distance, less than the first distance, along the axis, and wherein the first memory cell, the second memory cell and the third memory cell share a same chalcogenide material area that is not cut, the method comprising:

determining that a first bit of data of a plurality of bits of data is to be programmed and that a second bit of data of the plurality of bits of data is not to be programmed, wherein the first bit of data is located in a particular bit location of the plurality of bits of data and the second bit of data is located in a different bit location of the plurality of bits of data adjacent to the particular bit location;

replacing the second bit of data in the different bit location with a third bit of data of the plurality of bits of data that is to be programmed; and programming the first bit of data to the first memory cell and programming the third bit of data to the third memory cell.

8. The method of claim 7, wherein programming the first bit of data to the first memory cell and programming the third bit of data to the third memory cell comprises heating a portion of the chalcogenide material corresponding to each of the first memory cell and the third memory cell to a melting point of the chalcogenide material.

9. A method for programming data to an array of memory cells, wherein the array of memory cells comprise a first memory cell, a second memory cell that is adjacent to the first memory cell in a first direction along an axis, and a third memory cell that is adjacent to the first memory cell in a second direction along the axis that is opposite the first direction, wherein the first memory cell and the second memory cell are separated by a first distance along the axis and the first memory cell and the third memory cell are separated by a second distance, less than the first distance, along the axis, and wherein the first memory cell, the second memory cell and the third memory cell share a same chalcogenide material area that is not cut, the method comprising:

receiving a data word comprising a plurality of bits of data;

determining that a first bit of data of the data word is to be programmed and that a second bit of data of the data word is not to be programmed, wherein the first bit of data is located in a particular bit location of the plurality of bits of data of the data word and the second bit of data is located in a different bit location of the plurality of bits of data of the data word adjacent to the particular bit location;

remapping the data word comprising replacing the second bit of data in the different bit location of the plurality of bits of data of the data word with a third bit of data of the data word that is to be programmed; and programming the first bit of data to the first memory cell and programming the third bit of data to the third memory cell.

10. The method of claim 9, further comprising tracking the replacement of the second bit of data with the third bit of data.

11. The method of claim 9, wherein remapping the data word further comprises remapping the plurality of bits of data of the data word into a first plurality of bit pairs, wherein each bit of data of each bit pair of the first plurality of bit pairs is to be programmed.

12. The method of claim 11, wherein programming the first bit of data to the first memory cell and programming the third bit of data to the third memory cell comprising programming the first bit of data to the first memory cell of a plurality of memory cells and programming the third bit of data to the third memory cell of the plurality of memory cells.

13. The method of claim 12, wherein the plurality of memory cells comprises a first plurality of memory cell pairs whose memory cells are separated by the first distance along the axis and a second plurality of memory cell pairs whose memory cells are separated by the second distance along the axis, the method further comprising programming bit pairs of the first plurality of bit pairs to respective memory cell pairs of the second plurality of memory cell pairs.

14. The method of claim 9, wherein remapping the data word comprises moving a bit of data of the plurality of bits of data of the data word to a bit location of a remapped data word different than its bit location in the plurality of bits of data of the data word.

15. The method of claim 14, wherein moving the bit of data of the plurality of bits of data of the data word to the bit location of the remapped data word different than its bit location in the plurality of bits of data of the data word comprises moving a bit of data of the plurality of bits of data of the data word that is to be programmed, and wherein the bit location of that bit of data of the plurality of bits of data of the data word corresponds to a bit location of the data word containing a bit of data of the plurality of bits of data of the data word that is not to be programmed.

16. The method of claim 9, wherein programming the bit pairs of the first plurality of bit pairs to respective memory cell pairs of the second plurality of memory cell pairs comprises changing a resistance of the chalcogenide material for each memory cell of their respective memory cell pairs.

17. The method of claim 9, wherein programming the bit pairs of the first plurality of bit pairs to respective memory cell pairs of the second plurality of memory cell pairs comprises enabling a respective heater for each memory cell of their respective memory cell pairs.

18. The method of claim 17, wherein enabling the respective heater for each memory cell of their respective memory cell pairs comprises concurrently enabling the respective heater for each memory cell of their respective memory cell pairs.

19. The method of claim 9, wherein remapping the data word further comprises changing a bit order of the plurality of bits of data of the data word.

20. The method of claim 19, wherein changing the bit order of the plurality of bits of data of the data word comprises moving a bit of data of the plurality of bits of data of the data word that is to be programmed to a bit location of the plurality of bits of data of the data word containing a bit of data of the plurality of bits of data of the data word that is not to be programmed.

* * * * *